United States Patent
Abeywickrama et al.

(10) Patent No.: US 9,322,866 B2
(45) Date of Patent: Apr. 26, 2016

(54) METHOD AND APPARATUS FOR TRANSFORMER DIAGNOSIS

(71) Applicant: ABB Research Ltd., Zurich (CH)

(72) Inventors: Nilanga Abeywickrama, Vasteras (SE); Tord Bengtsson, Vasteras (SE)

(73) Assignee: ABB Research Ltd., Zurich (CH)

( * ) Notice: Subject to any disclaimer, the term of this patent is extended or adjusted under 35 U.S.C. 154(b) by 35 days.

(21) Appl. No.: 13/919,745

(22) Filed: Jun. 17, 2013

(65) Prior Publication Data

US 2013/0282312 A1 Oct. 24, 2013

Related U.S. Application Data

(63) Continuation of application No. PCT/EP2011/070356, filed on Nov. 17, 2011.

(30) Foreign Application Priority Data

Dec. 17, 2010 (EP) .................................... 10195712

(51) Int. Cl.
| | |
|---|---|
| *G01R 31/02* | (2006.01) |
| *G01R 31/06* | (2006.01) |
| *G01R 29/20* | (2006.01) |
| G01R 35/02 | (2006.01) |
| H02H 7/04 | (2006.01) |

(52) U.S. Cl.
CPC ............... *G01R 31/027* (2013.01); *G01R 29/20* (2013.01); *G01R 31/06* (2013.01); *G01R 35/02* (2013.01); *H02H 7/04* (2013.01)

(58) Field of Classification Search
CPC ...... G01R 31/027; G01R 31/06; G01R 29/20; G01R 31/026; G01R 31/025; G01R 31/1227; G01R 35/02; H02H 1/043; H02H 7/00; H02H 7/04; H02H 7/042; H02H 7/055; H01F 27/402

See application file for complete search history.

(56) References Cited

U.S. PATENT DOCUMENTS

| | | |
|---|---|---|
| 2004/0130329 A1 | 7/2004 | Suss et al. |
| 2004/0164745 A1 | 8/2004 | Ryder |
| 2009/0088995 A1 | 4/2009 | Tiberg et al. |
| 2010/0188240 A1 | 7/2010 | Wells |
| 2012/0158325 A1* | 6/2012 | Banerjee et al. ................ 702/58 |

OTHER PUBLICATIONS

J. Calvert, Inside Transformers, May 28, 2007, http://mysite.du.edu/~jcalvert/tech/transfor.htm, p. 6.*
International Preliminary Report on Patentability Application No. PCT/EP2011/070356 Completed: Mar. 22, 2013 21 pages.
International Search Report Application No. PCT/EP2011/070356 Completed: Feb. 20, 2012; Mailing Date: Feb. 28, 2012 4 pages.

* cited by examiner

*Primary Examiner* — Janet Suglo
*Assistant Examiner* — L. Anderson
(74) *Attorney, Agent, or Firm* — Whitmyer IP Group LLC

(57) ABSTRACT

A transformer diagnosis apparatus and method which can advantageously be used for on-line diagnosis of a transformer, and by which transformer properties may be monitored and/or determined. The diagnosis method includes collecting, for at least two different transformer loads, measurements of a current being indicative of the transformer load, as well as measurements of at least one further transformer AC signal. The method further includes deriving, from the collected measurements, at least two values of a quantity which depends on a transformer property as well as on transformer load; and determining, from the derived values, a set of coefficient(s) of a relation for how the quantity is expected to vary with transformer load. The method further includes using the determined coefficient(s) in performing a diagnosis of the transformer.

14 Claims, 9 Drawing Sheets

METHOD AND APPARATUS FOR TRANSFORMER DIAGNOSIS

FIELD OF THE INVENTION

The present invention relates to the field of power transformers, and in particular to on-line diagnosis of transformers.

BACKGROUND OF THE INVENTION

Transformers generally form an integral part of a power transmission system, providing the possibility of converting one voltage level to another. Transformers in power transmission systems often represent huge investments, and are typically not manufactured until ordered. In case a transformer in a power transmission system needs to be replaced, it is often a lengthy process to get a replacement. In order to avoid situations where a transformer needs to be replaced in a rescue action, it is desirable to detect an arising problem at an early stage, so that required maintenance or planned replacement can be performed.

Transformer on-line monitoring systems have been designed to detect and indicate, while the transformer is in operation, deviations in properties of the transformer which could indicate a deterioration of the transformer status. Examples of properties that can be monitored are temperature, combustible dissolved gas, and bushing capacitance.

The transformer impedance is a further property which has been used in transformer diagnostics. Conventionally, transformer impedance has been determined off-line, i.e. from measurements performed when the transformer was disconnected from the power transmission system.

In US2010/0188240, it is proposed to monitor the transformer impedance while the transformer is in operation. The possibility of on-line impedance monitoring would be of great benefit, since the impedance of a transformer carries useful information on the transformer status, while disconnecting a transformer from the power transmission system in order to determine the impedance is costly. In US2010/0188240, it is proposed to obtain information on the transformer impedance by measuring the current A and the voltage E at the transformer terminals, and to generate (in a three phase system) a 9×9 impedance matrix from such measurements using the relations $E_{iH}-E_{jL}=Z_{ij}a_{ij}$ and $A_{iH}=a_{i1}+a_{i2}+a_{i3}$, where $a_{ij}$ represent transformer terminal currents; indices H and L indicate "high voltage side" and "low voltage side", respectively; index i=1, 2, 3 indicates phases of the high voltage terminals; and index j=1, 2, 3 indicate phases of the low voltage terminals. As discussed in US2010/0188240, solving the equation system obtained by the proposed analysis introduces considerable computational complexity, and a simplification of the model is therefore proposed. However, even if such simplification is not employed, the accuracy of the results obtained by the proposed method will often not be sufficient for transformer diagnostic purposes.

SUMMARY OF THE INVENTION

An object of the present invention is to provide a more accurate method for on-line diagnostics of transformers.

This problem is addressed by a transformer diagnosis method which can be used for a transformer having at least a load winding and a source winding. The method comprises collecting, for at least two different transformer loads, measurements of a current being indicative of the transformer load, and measurements of at least one further transformer AC signal. The method further comprises deriving, from the collected measurements, at least two values of a quantity which depends on at least one transformer property as well as on transformer load, and determining, from the derived values, a set of coefficient(s) of a relation for how said quantity is expected to vary with transformer load. The method further comprises using at least one of said coefficient(s) in performing a diagnosis of the transformer.

By the inventive method is provided a way to determine values of transformer properties which are otherwise difficult to measure. Furthermore, the inventive diagnosis method can advantageously be used in on-line scenarios, thus facilitating for monitoring and diagnosis without having to take the transformer off line.

The term transformer AC signal is here used to refer to a signal from the set $\{I_1, I_2, V_1, V_2\}$, where $I_1, I_2$ are the currents through the source and load windings of the transformer, respectively, and $V_1, V_2$ are the voltages across the source and load sides of the transformer, respectively.

The collecting of measurements could be performed by receiving measurement signals directly from measurement equipment, or by receiving measurement data from another source, such as a computer readable memory or a different diagnosis apparatus.

The value of a coefficient can typically be described in terms of an expression involving at least one transformer property. Some coefficients are actually equal to the value of a transformer property, in which case the expression becomes simple. In one embodiment of the diagnosis method, the performing a diagnosis comprises using at least one coefficient for obtaining at least one transformer property, using the expression for how the coefficient depends on the transformer properti(es). Hence, in this embodiment, a value of a transformer property can be determined from on-line measurements, providing useful information on the status of the transformer. The determination of a transformer property can be repeated from time to time, by collecting further measurements at different loads, and determining a new set of coefficient(s) from which a new value of the property can be determined.

In one embodiment of the diagnosis method, performing a diagnosis includes collecting an on-line monitoring measurement of at least one terminal AC signal at a first monitoring load; deriving a measured-based value of the quantity from the monitoring measurement; and determining an expected value of the quantity at the first monitoring load by using said relation and said coefficient(s). The measured-based value of the quantity is then compared with the expected value of the quantity, so as to detect any transformer problem giving rise to a change in the quantity. Since the quantity depends on at least one transformer property, changes in a transformer property on which the quantity depends will be reflected in the value of the quantity. Hence, by on-line monitoring of the quantity, and on-line monitoring of the properties on which the quantity depends can effectively be achieved. If desired, the actual value of the transformer propertie(s) can be determined upon an indication of a change.

The collecting of an on-line monitoring measurement and the comparison with the corresponding expected value can be repeated as often as necessary or desired, for example in time ranges from seconds to years. Monitoring measurements could be performed on a regular basis, or on demand.

The relation for how the quantity varies with transformer load can be a linear relation, wherein the slope and/or the intersection at zero load is indicative of a transformer property. In one embodiment, the quantity is the difference between the voltage across the terminals of a first winding on a first side of the transformer and the voltage across a second winding on a second side of the transformer as reflected to the first side. In an implementation of this embodiment wherein the transformer only has one winding per side which carry significant power, the relation corresponds to:

$$\Delta V = Z_1 I_0 + \frac{z_w}{n} I_2, \text{ or}$$

$$\Delta V' = \frac{1}{n}\left[Z_1 I_0 + \frac{z_w}{n} I_2\right],$$

where $Z_1$ is the impedance of the source winding; $I_0$ is the magnetizing current; n is the ratio of the number of turns of the source winding to the number of turns of the load winding; $Z_w$ is the total winding impedance; $I_2$ is the load current; $\Delta V$ is the difference between the voltage across the terminals of the source winding and the voltage across the load winding as reflected to the source side; and $\Delta V'$ is the difference between the voltage across the source winding as reflected to the load side and the voltage across the terminals of the load winding. In this embodiment, transformer properties on which the coefficients of the relation depend are the total winding impedance, turn ratio, magnetizing current and the impedance of the source winding.

In another embodiment, the quantity is the source current. In an implementation of this embodiment wherein the transformer only has one winding per side which carry significant power, the relation corresponds to:

$$I_1 = \frac{1}{n} I_2 + I_0,$$

where $I_1$ is the source current; $I_2$ is the load current; $I_0$ is the magnetizing current; and n is the ratio of the number of turns of the source winding to the number of turns of the load winding. In this embodiment, information on the turn ratio and the magnetizing current at high load can be obtained.

In yet another embodiment, the quantity is the power loss in the transformer. In an implementation of this embodiment wherein the transformer only has one winding per side which carry significant power, the relation corresponds to:

$$S_{loss} = V_1 I_0^* + Z_1 \frac{I_0 I_2^*}{n} + Z_w \frac{I_2 I_2^*}{n^2},$$

where $S_{loss}$ is said power loss; $Z_1$ is the impedance of the source winding; $I_0$ is the magnetizing current; n is the ratio of the number of turns of the source winding to the number of turns of the load winding; $Z_w$ is the total winding impedance; $V_1$ is the voltage across the source winding and $I_2$ is the load current. In this embodiment, transformer properties on which the coefficients of the relation depend are the total winding impedance, turn ratio, magnetizing current and the impedance of the source winding. Assuming that these properties are already known (e.g. from the $\Delta V(\Delta V')$ and $I_2$-relations described above), information on the magnetisation power loss and the winding power loss can be obtained. The power loss in the transformer is a general indicator of many types of problems. By monitoring the power loss, a fast indication can most often be obtained in the case a problem occurs.

The problem is further addressed by a transformer diagnosis apparatus and embodiments thereof. The transformer diagnosis apparatus comprises: an input configured to receive signals indicative of AC signal measurements of a transformer, including measurements of the transformer load current; an output configured to deliver a transformer diagnosis result; and a coefficient generator (706) connected to the input. The coefficient generator is configured to collect, for at least two different transformer loads, measurements of a current being indicative of the transformer load, and measurements of at least one further transformer AC signal. The coefficient generator is further configured to derive, from the collected measurements, at least two values of a quantity which depends on a transformer property as well as on transformer load; and to determine, from the derived values, a set of coefficient(s) of a relation for how said quantity is expected to vary with transformer load. The transformer diagnosis apparatus further comprises a diagnosis mechanism arranged to use the set of coefficients in the generation of a diagnosis result. The diagnosis mechanism is connected to the coefficient generator and to the output of the transformer diagnosis apparatus (possibly via further components of the diagnosis apparatus).

The problem is also addressed by a transformer comprising a transformer diagnosis apparatus. The transformer could be a single phase transformer, or include further phases. The transformer could have two or more windings per phase. In an implementation wherein the transformer comprises a tap changer, the coefficient generator may be configured to generate a set of coefficients for each of the tap changer tap points. In such embodiment, the status monitor can be configured to determine, if a deviation is detected, at which tap changer position(s) the deviation occurs. Hereby is achieved that a position where a fault has occurred can be localized.

The problem is further addressed by a computer program for providing a diagnosis of a transformer, where the computer program, when run on a transformer diagnosis apparatus, will cause the diagnosis apparatus to perform the inventive method:

Further aspects of the invention are set out in the following detailed description and in the accompanying claims.

DETAILED DESCRIPTION OF THE INVENTION

Figure 1:
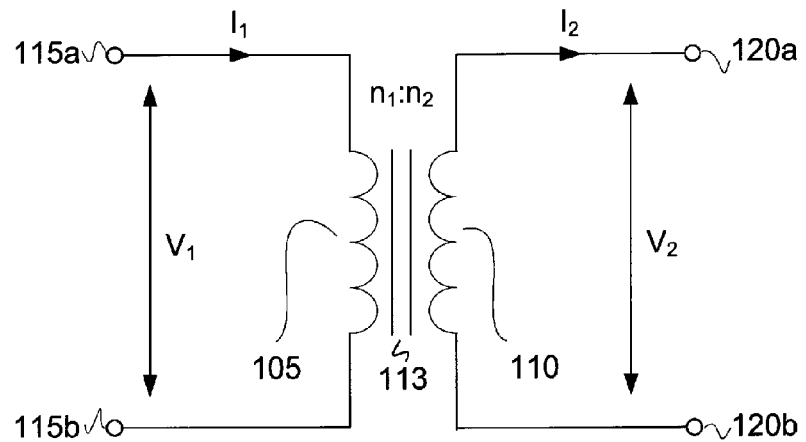
FIG. 1 is an illustration of an ideal transformer model.

In power transmission and distribution systems, transformers are typically used for transforming one voltage level into another, and/or for providing galvanic isolation between different sections of a power transmission system. A schematic illustration of a transformer 100 is shown in FIG. 1. The transformer 100 of FIG. 1 comprises a first winding 105, a second winding 110, a transformer core 113, a first pair of winding terminals 115a, 115b connected to the first winding 105, and a second pair of winding terminals 120a, 120b connected to the second winding 110. The voltage across the first winding 105 is denoted $V_1$, and the voltage across the second winding 110 is denoted $V_2$, while the current through the first winding 105 is denoted $I_1$ and the current through the second winding 110 is denoted $I_2$. The number of turns of the first winding is denoted $n_1$, and the number of turns on the second winding is denoted $n_2$, the ratio $n_1/n_2$ hereinafter being referred to as the turn ratio n. Note that, although an often used convention is to have n greater than 1, n as defined herein can be either smaller than, equal to, or greater than 1. Furthermore, in order to simplify the description, the voltage across a winding 105/110 will often be referred to as a terminal voltage, and a current through a winding 105/110 will often be referred to as a terminal current, although in some winding configurations, e.g. in a Δ three phase winding, the terminal voltages and currents will not directly reflect the winding voltages/currents, but will provide a means for deriving the winding voltages/currents.

In the following, for ease of description, it will be assumed that the first winding 105 is the winding which is fed by a source, and the second winding 110 is the winding which delivers power to a load. However, an opposite convention may alternatively be used.

In an ideal transformer with no losses, and hence of 100% efficiency, the following relations hold:

$$\frac{v_1}{n_1} = \frac{v_2}{n_2} \Longrightarrow \frac{v_1}{v_2} = \frac{n_1}{n_2} = n; \quad (1a)$$

$$n_1 \cdot I_1 = n_2 \cdot I_2 \Longrightarrow \frac{I_2}{I_1} = n \quad (1b)$$

$$Z_{source} = \frac{v_1}{I_1} = n^2 \cdot Z_{load}, \quad (1c)$$

where $$Z_{load} = \frac{v_2}{I_2},$$

where $Z_{source}$ is the impedance seen from the source side and $Z_{load}$ is the impedance seen from the load side.

However, a real transformer experiences apparent power losses, including both active and reactive power losses. The main sources of apparent power loss include:

Losses in the core, referred to as core loss or no-load loss: hysteresis losses and eddy current losses.

Losses in the windings: $I^2R$-losses, skin and proximity losses.

Stray losses: Losses in the metallic parts of the transformer, e.g. tank wall, due to stray magnetic fields.

In addition to the power loss, there typically exists a voltage drop through the transformer, due to the magneto-motive force associated with leakage magnetic flux and the resistance of the windings.

Figure 2A:
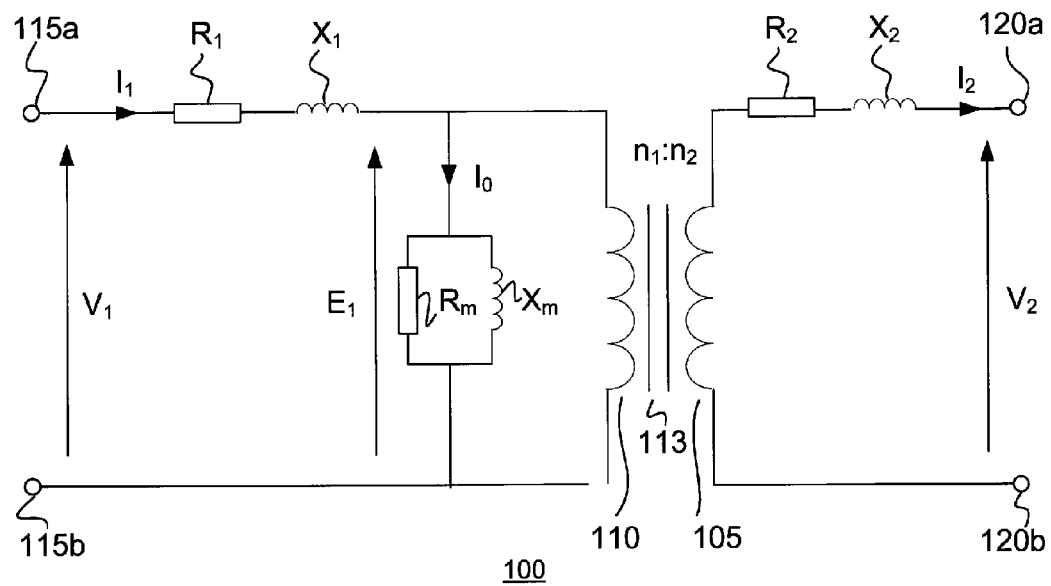
FIG. 2*a* is an illustration of a transformer model taking into account effects of magnetizing currents in the transformer core, leakage inductances and effective resistances of the primary and secondary windings.

FIG. 2a shows an example of an often used equivalent circuit for a non-ideal transformer 100, referred to as a first order model of a transformer 100. In addition to the transformer components shown in FIG. 1, i.e. windings 105, 110, the core 113 and the winding terminals 115a, 115b & 120a, 120b, FIG. 2a also illustrates the effects of the voltage drop through the transformer caused by leakage magnetic flux and of the apparent power losses discussed above. In FIG. 2a, the effects causing such voltage drop and apparent power loss are illustrated by including, in the equivalent circuit, the following elements:

a resistance of the source winding, $R_1$;

a leakage reactance of the source winding, $X_1$;

a resistance of the load winding, $R_2$;

a leakage reactance of the load winding, $X_2$;

a resistance representing the core losses, $R_m$; and a reactance representing the core magnetization, $X_m$;

where $R_1$ and $X_1$ are connected in series with the source winding 105; $R_2$ and $X_2$ are connected in series with the load winding 110; and $R_m$ and $X_m$, which are connected in parallel, form an equivalent shunt element which is connected in parallel with the source winding 105. The equivalent current through the equivalent shunt element is denoted $I_0$, whereas the voltage across the equivalent shunt element is denoted $E_1$. The current $I_0$ will hereinafter be referred to as the magnetizing current $I_0$.

Figure 2B:
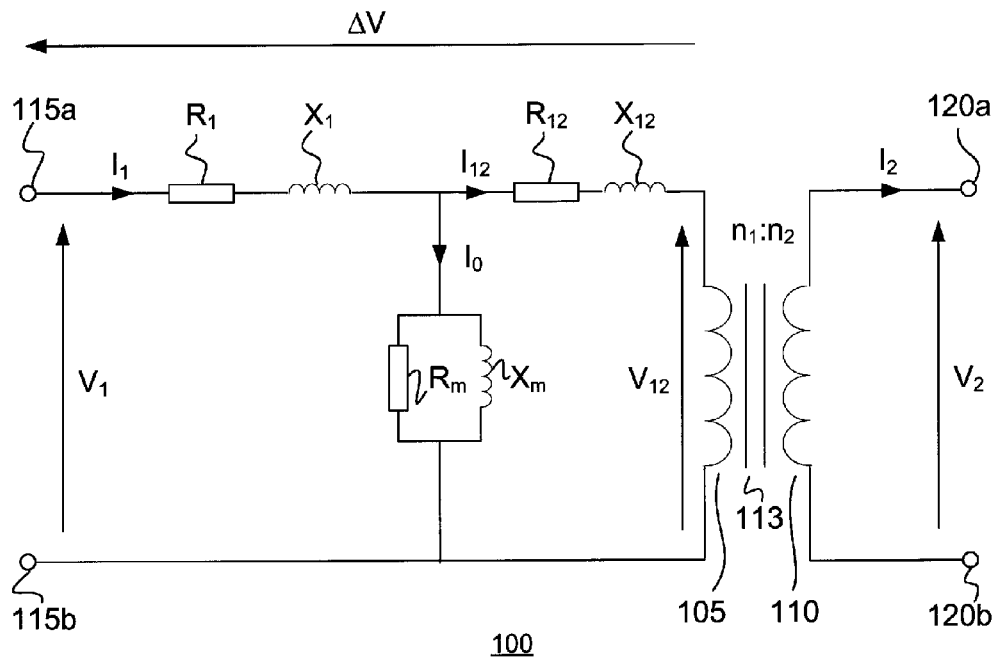
FIG. 2*b* is an alternative illustration of the transformer model shown in FIG. 2*a*, wherein the impedances on the load side have been reflected to the source side.
Figure 2C:
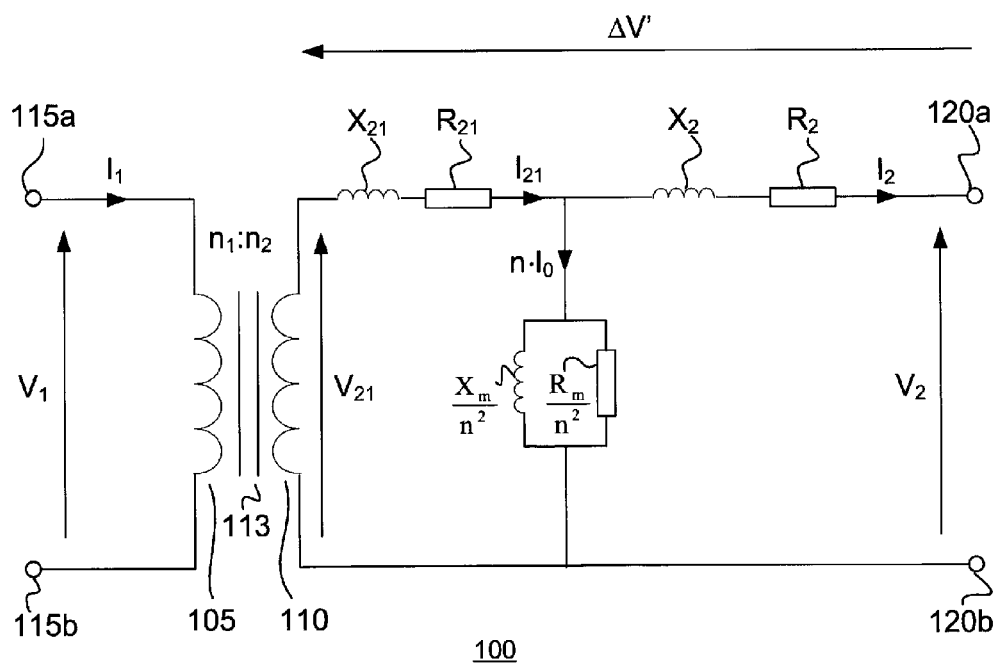
FIG. 2*c* is an alternative illustration of the transformer model shown in FIGS. 2*a* and 2*b*, wherein the impedances on the source side have been reflected to the load side.

Oftentimes, the first order transformer model of FIG. 2a is described in terms of an equivalent model, wherein the impedances are seen from a single side of the transformer only. Such equivalent models simplify the analysis of the transformer model, since the voltage level is generally different at the two sides. In FIG. 2b is shown an equivalent first order transformer model wherein the load side impedances have been reflected to the source side, while FIG. 2c shows an equivalent first order transformer model wherein the source side impedances have been reflected to the load side. The following notation is used in FIGS. 2b and 2c:

$R_{12}$: the resistance of the load winding reflected to the source side;

$X_{12}$: the leakage reactance of the load winding reflected to the source side;

$R_{21}$: the resistance of the source winding reflected to the load side, $$R_{21} = \frac{R_1}{n^2};$$

$X_{21}$: the leakage reactance of the source winding reflected to the load side, $$X_{21} = \frac{X_1}{n^2};$$

$R_m$: the equivalent resistance representing the core losses, as seen from the source side;
$X_m$: the equivalent reactance representing the core magnetization, $X_m$;

$$I_{12} = \frac{I_2}{n};$$

$$I_{21} = nI_1.$$

For purposes of ease of description only, the following description will generally be made in terms of the transformer model shown in FIG. 2b. However, an equivalent analysis could be made based on the equivalent transformer model shown in FIG. 2c.

Conventionally, the magnitude of the equivalent circuit components listed above can be determined by off-line measurements. The total impedance $Z_w$ of the transformer windings, often referred to as the short circuit impedance $Z_w$, can be estimated off-line as the ratio between an applied voltage and the current drawn by the transformer on the source side while the load side is short-circuited, where the total winding impedance corresponds to the sum of the series impedance $Z_1$ of the source-side winding and the series impedance $Z_{12}$ of the load-side winding as seen from the source side, i.e.

$$Z_w = Z_1 + Z_{12} = (R_1 + jX_1) + (R_{12} + jX_{12}).$$

$Z_{12}$ is often referred to as the reflected impedance on the source side, and can be expressed as $Z_{12} = n^2 Z_2$. The resistance of a winding (cf. $R_1$ and $R_{12}$) can be measured by conventional methods, for example by applying a voltage and measuring the resulting current in steady state. Furthermore, values of the components $R_m$ and $X_m$ of the magnetizing branch can be estimated by performing no-load measurements, during which only the magnetizing current $I_0$ flows into the transformer.

Moreover, once the short circuit impedance $Z_W$ has been determined by means of off-line measurements, another fundamental characteristic of the transformer can be determined, namely the turn ratio n. The turn ratio can be determined off-line by means of no-load voltage measurements, using the following relation, where the influence of the magnetization current is often neglected:

$$V_1 = n \cdot V_2 + Z_2 I_0 \approx n \cdot V_2 \quad (2)$$

However, as mentioned above, a more frequent monitoring of the transformer is desired than can feasibly be achieved by off-line measurements.

The method presented in US2010/0188240, wherein on-line measurements of the terminal voltages and currents are used to calculate values of the transformer impedance, can provide a rough estimate of the transformer impedance in an on-line scenario. However, US2010/0188240 does not take any magnetizing current into account, but assumes that the entire voltage drop across the windings 105 and 110 is caused by the load current over the transformer impedance (which in US2010/0188240 is defined as an impedance matrix). The influence of the magnetizing current on the impedance and turn ratio calculations is often non-negligible, and moreover, this influence is not constant, so that the accuracy of any values of the transformer impedance derived by use of the method suggested in US2010/0188240 will typically be poor.

An improved analysis of the results from measurements of the terminal voltages and currents during operation of a transformer 100 is suggested below. According to the invention, a diagnosis of a transformer 100 can be obtained by means of collecting, for at least two different transformer loads, measurements of a current being indicative of the transformer load, as well as measurements of at least one further terminal AC signal. From such measurements, the coefficients of a relation between a quantity T and the transformer load can be established, where the quantity T depends on a transformer property to be determined as well as on the transformer load, while at the same time being obtainable from the collected measurements.

By using the coefficients of the relation describing how the quantity T is expected to vary with load, a value of a transformer property, on which the value of T depends, can be derived. A quantity T can typically be described as a sum of a load dependent term and a term which is independent on load, although quantities T having other load dependencies can be contemplated.

By using a quantity T which is obtainable from the measurements of at least one AC signal, where the quantity T depends on the transformer property to be determined as well as on the transformer load, the transformer property can be extracted from the variation of the quantity T with transformer load. Thus, by performing measurements at at least two different transformer loads, a suitable analysis of the quantity variation with load will give information on the value of the property to be determined. As will be seen below, examples of transformer properties that can be determined by an analysis as described above are the short circuit impedance $Z_w$, the turn ratio n and the magnetization current $I_0$.

The suggested analysis could be used to determine, from on-line measurements of terminal AC signals, an absolute value of a transformer property. Furthermore, the analysis could be used in on-line monitoring of the status of the transformer. When using the analysis for on-line monitoring purposes, the coefficients of the relation between the quantity T and the transformer load $I_2$ are typically first determined under circumstances reflecting a normal state of the transformer. The value of the quantity T is then monitored, so that any significant deviation in the value of the quantity T as measured from the quantity T as obtained by use of the determined normal state T-load-relation will be detected.

By taking the magnetizing current in the transformer into account when determining the relation between the quantity T and the transformer load $I_2$, the accuracy of the monitoring and the accuracy of the determination of the absolute value of the transformer property will be improved.

The T($I_2$) relation used in the analysis can for example be based on the equivalent circuit of the first order model shown in FIG. 2a. In this context, a transformer property is related to the parameters of the first order transformer model, often in a manner such that a transformer property of interest is represented by a parameter of the transformer model. As will be seen below, useful quantities T, the load dependency of which could provide information on interesting transformer properties, include the terminal current $I_1$ on the source side of the transformer (which in the convention used herein is the primary side); the difference between the load-side terminal voltage $V_1$ and the load-side voltage $V_{12}$ as seen from the source side, this difference hereinafter referred to as the voltage drop, $\Delta V$; and the power loss $S_{loss}$ in the transformer.

From FIG. 2b, it can be seen that the terminal voltages, $V_1$ and $V_2$, and the terminal currents, $I_1$ and $I_2$, which are all measurable quantities, show a different relationship in a non-ideal transformer than that presented for an ideal transformer in expressions (1a) and (1b). However, the non-measurable quantities $V_{12}$ and $I_{12}$, corresponding to the load voltage and load current as seen from the source side, are related to $V_2$ and $I_2$ in the same way as $V_1$ and $I_1$ are related to $V_2$ and $I_2$ in expressions (1a) and (1b):

$$\frac{V_{12}}{n_1} = \frac{V_2}{n_2} \Longrightarrow \frac{V_{12}}{V_2} = \frac{n_1}{n_2} = n; \quad (3a)$$

$$n_1 \cdot I_{12} = n_2 \cdot I_2 \Longrightarrow \frac{I_2}{I_{12}} = n \quad (3b)$$

Thus, if the turn ratio n is known, the load voltage $V_{12}$ as seen from the source side can be obtained from the load terminal voltage, $V_2$, and the voltage drop $\Delta V$ can thus be obtained from measurements:

$$\Delta V = V_1 - V_{12} = V_1 - n \cdot V_2 \quad (4a),$$

where expression (4a) is a measurement-based expression for obtaining a value of $\Delta V$ (being an example of a quantity T) from measurements of transformer AC signals. As will be seen below, a value of the turn ratio n can be obtained from an analysis of a further quantity T, or could be assumed to take the nameplate value.

The voltage drop $\Delta V$ represents the voltage drop caused by the magnetizing current $I_0$ and the current $I_{12}$ (load current reflected on the source side) flowing through the transformer impedance (cf. FIG. 2). Assuming the first order transformer model, $\Delta V$ can alternatively be expressed as:

$$\Delta V = V_1 - V_{12} \approx (R_1 + jX_1) \cdot I_0 + ((R_1 + jX_1) + (R_{12} + jX_{12})) \cdot I_{12} = \quad (4b)$$

$$Z_1 \cdot I_0 + (Z_1 + Z_{12}) \cdot I_{12} = Z_1 I_0 + Z_w I_{12} = Z_1 I_0 + \frac{Z_w}{n} I_2.$$

Thus, assuming that the magnetizing current $I_0$ is constant, the voltage drop vs. load can be described by a linear expression, with the slope of the dependency corresponding to the total winding impedance, $Z_w$. At high loads, the variations in magnetizing current $I_0$ are insignificant, and the linear relation of expression (4b) will accurately describe the relationship between the voltage and transformer load. In this regard, high loads could for example be loads for which $I_1 \gtrsim 10 I_0$. The intercept of this linear dependency with the $\Delta V$-axis at zero load corresponds to the product of the magnetizing current $I_0$ and the first winding impedance $Z_1$. As will be seen below, the high load magnetizing current $I_0$ can be obtained from studies of the source side current $I_1$ vs. load current $I_2$, and thus, the source winding impedance $Z_1$ can be determined from the intercept of the linear expression (4b). The load winding impedance $Z_{12}$ can then be determined from the total winding impedance $Z_W$ determined from the gradient of the linear expression (4b).

A useful relation between the source-side current $I_1$ and the transformer load, expressed as the load-side current $I_2$, can be identified by studying FIG. 2:

$$I_1 = \frac{1}{n} I_2 + I_0. \quad (5a)$$

Here, the quantity T is the source current, which can simply be obtained from $I_1$-measurements:

$$I_1 = I_1 \quad (5b),$$

where expression (5b) is a measurement-based expression for obtaining a value of $I_1$ from measurements of a transformer terminal AC signal.

Thus, the source-side current $I_1$ shows a linear dependency on the load-side current $I_2$, where the slope of the dependency corresponds to the inverse of the transformer turn ratio n. Thus, from measurements of the source-side current $I_1$ at different loads, a value of the turn ratio n can be obtained. Moreover, as can be seen from expression (5a), the intercept with the $I_1$-axis at zero load corresponds to the magnetizing current, $I_0$. Hence, by measuring the source-side current at different loads, and extrapolating the linear dependency expressed in (5a) to zero load, a value of the magnetizing current $I_0$ can be obtained.

Thus, once an expected relation between a quantity T (such as $\Delta V$ or $I_1$) and the transformer load $I_2$ has been determined, any deviation in a transformer property (such as $Z_W$, $I_0$ or n) on which the quantity T depends can be detected by further measurements of the suitable terminal AC signals.

As seen in expressions (4b) and (4a), the quantities $\Delta V$ and $I_1$ both show a linear dependency on load. When the $T(I_2)$-relation is a linear expression, the coefficients of the linear expression can be determined, from the measured values obtained in step 503, by means of a suitable linear regression method, such as for example a least square fit.

The power loss $S_{loss}$ inside the transformer 100, on the other hand, is a quantity T which shows a quadratic dependency on load. The power loss $S_{loss}$ can be obtained as the difference between the apparent power input, $S_{in}$, and the apparent power output, $S_{out}$, of the transformer 100:

$$S_{loss} = S_{in} - S_{out} = V_1 \cdot I_1^* - V_2 \cdot I_2^* \quad (6a).$$

Expression (6a) represents a measurement-based expression for the power loss. By measuring the AC signals $I_1$, $I_2$, $V_1$ and $V_2$, a measurement value of $S_{loss}$ can be determined, $S_{loss}^{measured}$.

Furthermore, assuming that the first order transformer model applies, the power loss can be expressed in terms of the load current, $I_2$, as follows:

$$S_{loss} = (V_1 - Z_1 I_1) I_0^* + Z_1 I_1 I_1^* + Z_{12} \frac{I_2 I_2^*}{n^2} \quad (6b)$$

$$= V_1 I_0^* - Z_1 \left(\frac{I_2}{n} + I_0\right) I_0^* + Z_1 \left(\frac{I_2}{n} + I_0\right)\left(\frac{I_2}{n} + I_0\right)^* + Z_{12} \frac{I_2 I_2^*}{n^2} =$$

$$= V_1 I_0^* + Z_1 \left(\frac{I_2}{n} + I_0\right) \frac{I_2^*}{n} + Z_{12} \frac{I_2 I_2^*}{n^2} = V_1 I_0^* + Z_1 \frac{I_0 I_2^*}{n} + Z_w \frac{I_2 I_2^*}{n^2} =$$

$$= a + b I_2^* + c |I_2|^2,$$

where $Z_1$ is the impedance of the source winding 105 and $Z_{12}$ is the impedance of the load winding 110 reflected to the source side.

From a set of measurements of the AC signals $I_1$, $I_2$, $V_1$ and $V_2$ performed at different loads, the coefficients a, b and c of expression (6b) can be determined, e.g. by means of a least square fit. By use of the determined $S_{loss}(I_2)$ relation, the power loss can be monitored in on-line monitoring measurements in order to detect a deviation from the expected value obtained from expression (6b), using the derived coefficients. A deviation of the measured power loss from the expected relation provided by expression (6b) could for example be used as a trigger for a further analysis of the measured values, for example an analysis using expression (4b) and/or (5a). Furthermore, the coefficients of expression (6b) could be used for obtaining information on the value of the transformer properties $I_0$, n, $Z_w$ and $Z_1$. In combination with information obtained either from studies of other quantities T such as $\Delta V$ or $I_2$, or from other sources of information (for example, assuming that nameplate turn ratio applies), a value of these transformer properties could be obtained from determined coefficients a, b and c. Furthermore, the constant term in expression (6b), referred to as a, provides a value of the no load loss at rated voltage when $V_1$ equals the rated voltage.

Still assuming that the first order transformer model applies, the power loss, $S_{loss}$, can be divided into a contribution from magnetization and other stray losses, $S_{loss}^{magn}$, and a contribution from winding losses, $S_{loss}^{winding}$:

$$S_{loss} = V_1 \cdot I_1^* - V_2 \cdot I_2^* = V_1 \cdot I_1^* - n \cdot V_2 \cdot \frac{I_2^*}{n} = V_1 \cdot I_1^* - V_{12} \cdot I_{12}^* = \quad (6c)$$
$$V_1 \cdot I_1^* - (V_1 - \Delta V) \cdot I_{12}^* = V_1 \cdot (I_1^* - I_{12}^*) + \Delta V \cdot I_{12}^* \approx V_1 \cdot I_0^* + \Delta V \cdot I_{12}^*$$
$$V_1 \cdot I_0^* + \Delta V \cdot \frac{I_2^*}{n} = S_{loss}^{magn} + S_{loss}^{winding}.$$

By separating the power loss $S_{loss}$ into a magnetization contribution, $S_{loss}^{magn}$, and a winding loss contribution $S_{loss}^{winding}$ winding as in expression (6c), one can obtain further information regarding the source of any unexpected power loss. The power loss contributions can be determined from values of the magnetising current $I_0$ and the turn ratio n determined in accordance with the above.

Information relating to whether one or both of the power loss contributions increases in an unexpected manner can be used to identify if a problem has occurred in the core 113 and/or in the windings 105/110. Furthermore, if there is an unexpected increase in the power loss, without an increase in either of the magnetization contribution and the winding loss contribution, one can conclude that the increase is caused by a further source of power loss.

Analysis of a quantity T can give information on more than one transformer property, depending on which transformer properties that influence the quantity as a function of load. For example, analysis of the linear dependency $I_1(I_2)$ can provide information on the turn ratio n (slope) and on the magnetizing current $I_0$ (intercept). Furthermore, an analysis can be performed on more than one quantity T, obtained from the same set of data, in order to obtain information on more than one transformer property. For example, I and V measurements at different loads can be used to obtain information on any combination of the quantities $S_{loss}(I_2)$; $I_1(I_2)$ and $\Delta V(I_2)$. Different quantities T could then be used for deriving values of different transformer properties. Alternatively, or additionally, different quantities T could be used for deriving values of the same transformer propertie(s), in order to check the consistency of the results. Furthermore, more than one quantity T could be used when an analysis of a quantity T as a function of load provides a value of a combination (product/quotient) of more than one transformer property—additional quantity(es) T could then be used to separate the properties that are determined as a combination. For example, if n, $Z_1$, $I_0$ and $Z_w$ are all unknown, an analysis of $\Delta V$ as a function of load (cf. expression 4b) can provide information on the combinations $Z_1 I_0$ and $Z_w/n$. An analysis of $S_{loss}$ as function of load can provide a value of further combinations of the transformer properties n, $Z_1$, $I_0$ and $Z_w$; and a separation of the combinations could hence be made by using values of combinations obtained from both $\Delta V$ and $S_{loss}$.

As mentioned above, measurements of terminal AC signals could be used in monitoring of a transformer property over time, so as to detect changes in the transformer property. Detected changes in the transformer impedance $Z_W$ typically indicate that there is a contact problem and/or geometrical deformation/displacement of the windings. Contact problems could for example include broken winding strands; terminal contact problems, an increased resistance at contact points in for example a tap changer, etc. Geometrical deformation/displacement of the windings will typically alter the winding reactance X. Deviations in the imaginary part of the transformer impedance $Z_w$ are typically associated with issues relating to the transformer geometry, while deviations in the real part are typically associated with contact problems.

Detected changes in the turn ratio n typically indicate turn-to-turn faults, such as short circuits between turns.

Detected changes in the magnetizing current $I_0$ typically indicate a deteriorated transformer core 113, such as for example unwanted grounding of the core 113, mechanical deformation of lamination and joints forming the core 113, short-circuiting of core lamination packets, or significant eddy currents on other parts of the transformer, e.g. around the surface of the core 113 etc.

Figure 3:
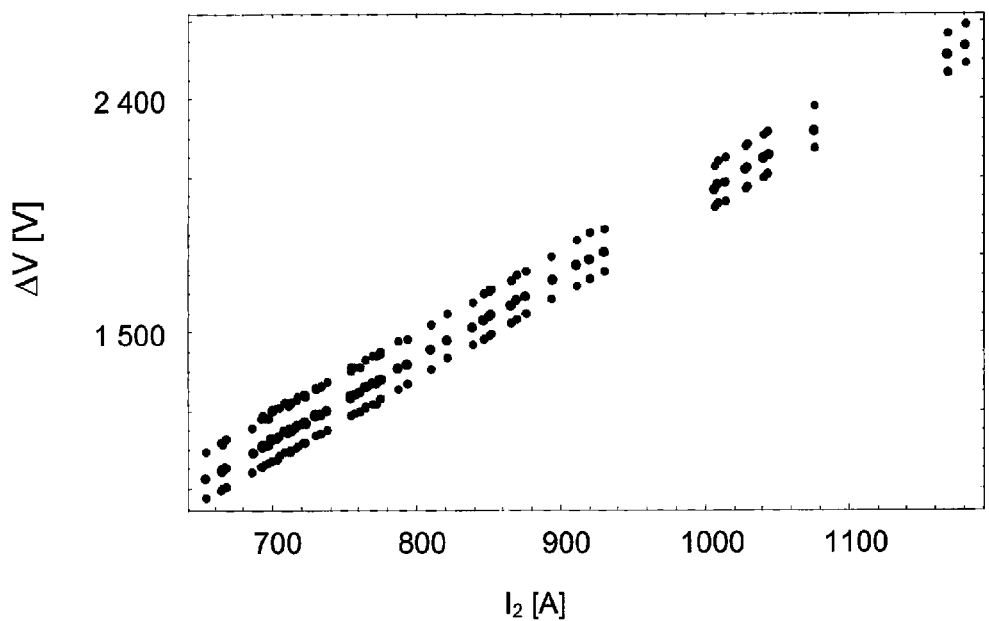
FIG. 3 is a graph showing $\Delta V$ as a function of $I_2$ for a transformer, where $\Delta V$ is the difference between source terminal voltage and the load terminal voltage as seen from the source side and $I_2$ is the load current, and where different values of $\Delta V$ was obtained from measurements of the source and terminal voltages at different transformer loads.
Figure 4:
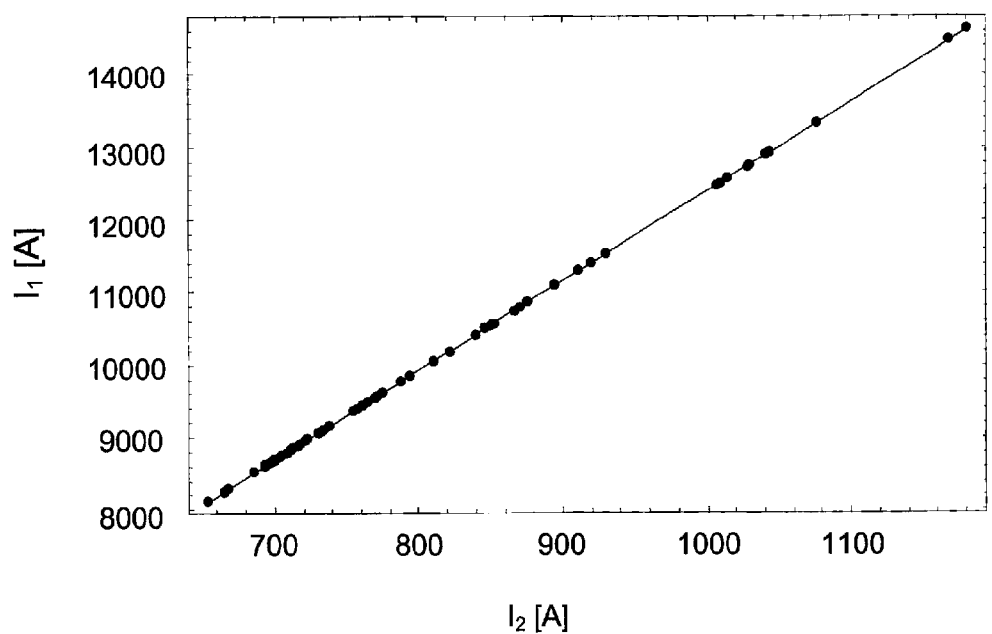
FIG. 4 is a graph showing experimental results of $I_1$ vs. $I_2$, where $I_1$ is the source terminal current and $I_2$ is the load current.

Thus, by monitoring one or more transformer properties, significant information about the status of the transformer 100 can be obtained. Experimental results performed on measurements collected from a transformer 100 are shown in FIGS. 3 and 4. The AC signals presented in FIGS. 3 and 4 are complex magnitudes, and, to simplify the graphs, the absolute values of the AC signals are shown in the graphs.

In FIG. 3, experimental results of $\Delta V$ are plotted as a function of $I_2$. The transformer used for this analysis is a three phase transformer of rating 160 MVA, 220/11 kV and turn ratio $n=8.1163 \cdot 10^{-2}$. The plotted values refer to one of the phases. In order to investigate the sensitivity of the determination of the transformer properties on the assumed value of the turn ratio n, the analysis has been performed for three different values of n: The results forming the middle line were obtained using the nameplate turn ratio $n_{nameplate}$, the results forming the bottom line were obtained using $n=0.99 \cdot n_{nameplate}$ while $n=1.01 \cdot n_{nameplate}$ was used to obtain the results of the top line. As can be seen in the graph of FIG. 3, a small error in the assumed value of n will not significantly influence the value of the deduced total impedance $Z_{12}$. For example, in the experimental set-up illustrated by the graph of FIG. 3, a 1% change in n will only alter the total winding impedance $Z_W$ deduced from the linear fits by around 0.05%. One may thus conclude that the winding impedance $Z_W$ can be determined with high accuracy, even when the assumed value of the turn ratio n is slightly in error. Furthermore, as discussed above, the turn ratio n can be accurately determined using expression (5a), and such determined value can be used in a $\Delta V$-analysis of the transformer. The influence of an incorrect value of n will typically be more noticeable in the no-load voltage drop, and hence, in order to obtain an accurate analysis result of the components of the no-load voltage drop term, a turn ratio determined by using expression (5a) can be useful.

In FIG. 4, experimental results of $I_1$ have been plotted as a function of $I_2$ for the same transformer (and same phase) as the results shown in FIG. 3. A line corresponding to the linear expression (5a) is also included in the graph. A value of the magnetizing current $I_0$ can be obtained from the graph in FIG.

4, as the intercept of the linear fit with the $I_1$ axis at zero load. This value will correspond to the magnetizing current $I_0$ at high load (typically, the magnetizing current at low load deviates slightly from this value, since the magnetization of the core 113 shows a non-linear behaviour, and also there is a slight increase in supply voltage at very light load). Hence, in order to reduce the influence of the variation of $I_0$ with load, one could advantageously only include measurements where $I_1 \gtrsim 10 I_0$ when performing an analysis of the $I_1(I_2)$-relation, as well as for the $\Delta V$-analysis discussed in relation to expression (4b) and FIG. 3.

As $I_1$ and $I_2$ are complex numbers, a linear fit may result in a value of n having a small imaginary part. Since the turn ratio should be a real number, the magnitude of the imaginary part obtained from the line fit reflects the accuracy of the fit. A small imaginary part can generally be neglected, while a more significant imaginary part indicates that the accuracy of the fit is insufficient. A check of the magnitude of the imaginary part of n could hence serve as a consistency test of the analysis of n, as well as of $I_0$ and $Z_W$. The low load measurements, for which $I_0$ deviates significantly from the high load value, will influence the derived value of n so as to increase the imaginary part. Hence, the linear fit could advantageously be made using the high load values.

The magnetizing current $I_0$ typically varies with source voltage $V_1$. Hence, the measurements used for obtaining a relation between a quantity T and the transformer load $I_2$ should preferably be measured at similar source voltages $V_1$. Furthermore, in case the analysis is used in an on-line monitoring situation, the source voltage $V_1$ at which monitoring of the transformer takes place should preferably be similar to the voltage level at which the relation was established. Measurements at which the source voltage $V_1$ significantly deviates from the rated voltage could hence advantageously be excluded from the analysis.

Figure 5:
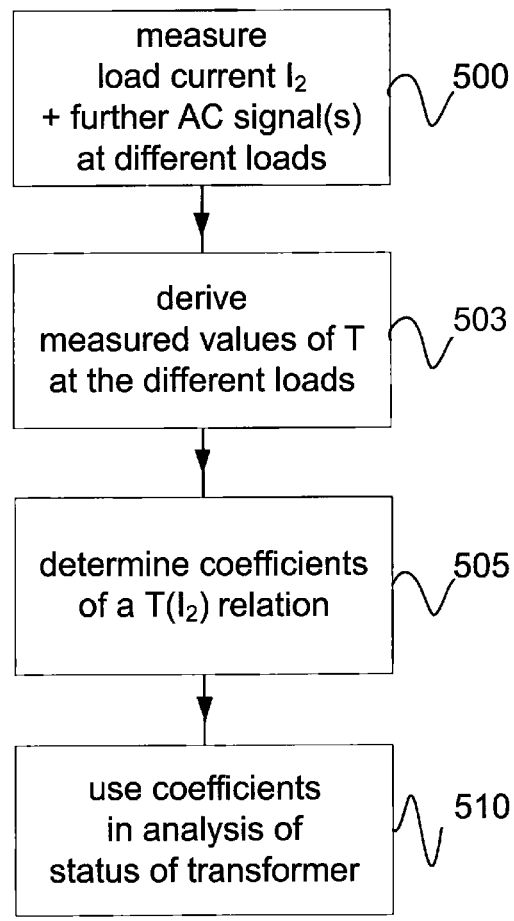
FIG. 5 is a flowchart schematically illustrating an embodiment of an inventive method.

In FIG. 5, a flowchart is shown which schematically illustrates an embodiment of an inventive method wherein an analysis as discussed above is used in diagnosing the status of a transformer 100. In step 500, measurements of the load current, as well as of at least one further AC signal, are performed at different loads. At step 503, measured values of T are derived at the different loads, using a suitable measure-based expression (cf. expressions (4a), (5a) and (6a). At step 505, a set of at least one coefficient(s) of a $T(I_2)$ relation are determined by fitting the measured T-values to the applicable $T(I_2)$-relation (cf. expressions (4b), (5a) and (6b)). Steps 500, 503 and 505 can be referred to as a learning phase of the diagnosis.

At step 510 of FIG. 5, the coefficients determined in step 505 are used to analyse the status of the transformer 100.

Figure 6A:
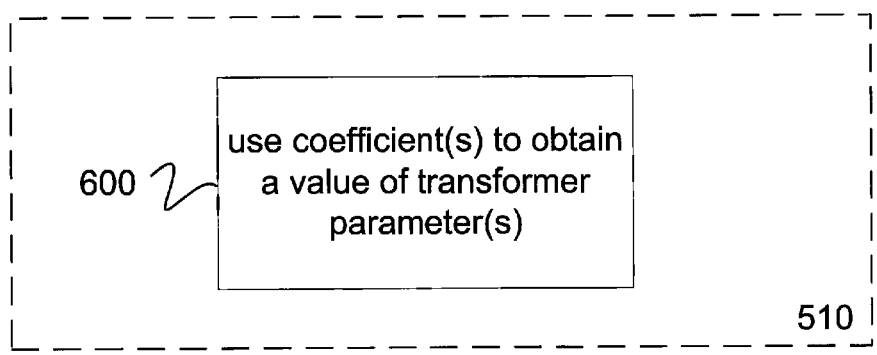
FIG. 6*a* is a flowchart schematically illustrating an example of a use of a $T(I_2)$-relation determined by means of the method shown in FIG. 5.

In FIG. 6a, an embodiment of step 510 of the method of FIG. 5 is shown as a step 600. In step 600, the coefficients obtained in step 505 are used to obtain the value of one or more transformer properties. In some instances, a coefficient in itself represents the value of a transformer parameter, in which case step 600 is very simple. In table 1, an overview is provided of examples of different quantities T which can be used to determine or monitor transformer properties by use of different embodiments of the invention. Examples of transformer properties that can be obtained by analysing the different $T(I_2)$-relations are also given. The AC signals which are used to obtain a value of T are also shown, including the AC signal used to determine the load. The load is typically obtained from measurements of $I_2$.

TABLE 1

Examples of quantities T which can be used to determine or monitor transformer properties by use of different embodiments of the invention.

| Quantity T | $T(I_2)$-relation | Transformer properties | AC signals |
|---|---|---|---|
| $\Delta V$ | $\Delta V = Z_1 I_0 + \dfrac{Z_w}{n} I_2$ | $Z_w$ $Z_1$ $I_0$ at high load n | $I_2$ $V_1 \& V_2$ |
| $I_1$ | $I_1 = \dfrac{1}{n} I_2 + I_0$ | $I_0$ at high load n | $I_2 \& I_1$ |
| $S_{loss}$ | $S_{loss} = V_1 I_0^* + Z_1 \dfrac{I_0 I_2^*}{n} + Z_w \dfrac{I_2 I_2^*}{n^2}$ | $Z_w$ $Z_1$ $I_0$ at high load n | $I_1 \& I_2$ $V_1 \& V_2$ |

Figure 6B:
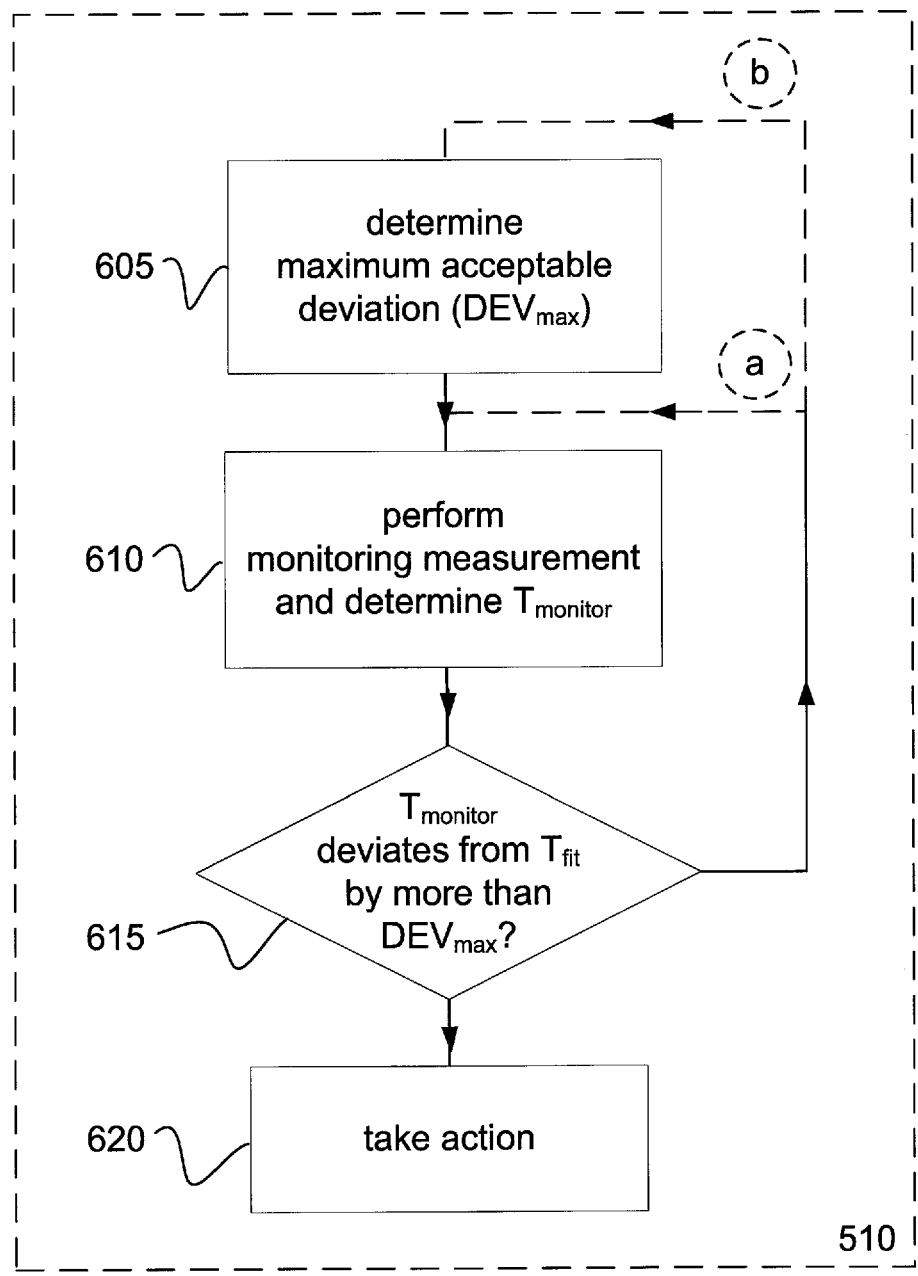
FIG. 6b is a flowchart schematically illustrating a further example of a use of a $T(I_2)$-relation determined by means of the method shown in FIG. 5.

In FIG. 6b is shown a flowchart which schematically illustrates a further example of how the coefficients, determined in step 505, can be used in the analysis of the status of a transformer 100. The flowchart in FIG. 6b illustrates an example of an on-line monitoring process according to the invention. In step 605, a maximum acceptable deviation, $DEV_{max}$, is determined, representing the maxim acceptable deviation of a measured value of T from a value of T derived by use of an expected $T(I_2)$ relation. This is typically done by analysing the measurement results obtained in step 500. In one implementation, $DEV_{max}$ is determined as certain number b of standard deviations σ, $DEV_{max} = b\sigma$. Other ways of determining $DEV_{max}$ can be contemplated, such as for example as the maximum deviation of a certified set of measurements, or as a fixed value. In an implementation where $DEV_{max}$ is based on the standard deviation, a load-specific value of σ can be determined for each load at which measurements have been taken. Further values of σ could then be extrapolated for loads at which no measurements are available, if necessary. Alternatively, a general estimate of σ could be obtained from the distribution of $$\frac{T_{fit} - T_{measured}}{T_{fit}},$$

where $T_{measured}$ is a measured value of T at a particular load, while $T_{fit}$ is the value of T expected from the relation obtained in step 505 at the particular load. In one implementation, a combination of a general estimate of σ and load-specific values of σ are used, so that the general estimate of σ is used when there is no load-specific value of σ obtained from measurements at the particular load, thus benefiting from the more narrow load-specific distribution when there are measurements available at the particular load, while using a general estimate of $DEV_{max}$ at other loads.

At step 610 of FIG. 6b, a monitoring measurement of the load, as well as of further AC signal(s) required in order to obtain a value of T, are performed (cf. Table 1). A value of T, referred to as $T_{monitor}$, is then determined from the monitoring measurement. At step 615, the deviation of $T_{monitor}$ from the expected value $T_{fit}$ at the present load is determined. This deviation is in one implementation defined as $$\frac{T_{fit} - T_{monitor}}{T_{fit}}.$$

Furthermore, at step 615, it is determined whether the deviation of $T_{monitor}$ from $T_{fit}$ exceeds the maximum acceptable deviation, $DEV_{max}$.

If the present deviation of $T_{monitor}$ from $T_{fit}$ is less than $DEV_{max}$, a further monitoring measurement is performed by re-entering step 610. As shown in FIG. 6*b*, the re-entering of step 610 could be preceded by a re-determination of $DEV_{max}$ (cf. path b of FIG. 6*b*), or step 610 could be entered using the previous value of $DEV_{max}$ (cf. path a). If several monitoring measurements are taken at a similar load, a new definition of the maximum acceptable deviation could be obtained by including the monitoring measurement(s) obtained in step 610 in the T-distribution on which the value of $DEV_{max}$ is based. A re-determination of $DEV_{max}$ could e.g. also be useful if a new load range, for which monitoring has not previously been performed, has been entered.

If it is found in step 615 that the present deviation of $T_{monitor}$ from $T_{fit}$ exceeds $DEV_{max}$, then step 620 is entered. In step 620, appropriate action is taken. In one implementation, the action taken in step 620 is to determine the present value of a transformer property obtainable from the quantity T (cf. Table 1). A further analysis of the status of the transformer 100 could also be triggered upon entering step 620, in order to determine the cause for such deviation. Such further analysis, or diagnosis of the transformer, could for example include checking the temperature, gas level, an analysis based on a further quantity $T(I_2)$, etc. In one implementation, the entry into step 620 will trigger more frequent monitoring measurements, in order to allow for a close watch of the development of the status of the transformer. In one implementation, the entry into step 620 will trigger the issuing of an alarm, the alarm indicating to an operator of the transformer 100 that a further investigation into the status of the transformer 100 is desired. Such alarm could for example be a light indication, a sound indication, the transmission of an e-mail or an SMS to a predetermined e-mail address or cell phone number, or any suitable alarm, or a combination thereof. A further possible action to be taken in step 620 is to perform a planned disconnection of the transformer 100 in order to perform off-line investigations based on a different analysis technique.

The value of $DEV_{max}$ will typically depend on what actions will be taken in step 620 if a deviation from the expected value of T is detected. If the action to be taken is to plan a disconnection of the transformer 100, the desired value of $DEV_{max}$ will typically be higher than if the action in step 620 is to perform a further analysis of the measured data, or to increase the monitoring measurement rate. Suitable values of $DEV_{max}$ could for example lie within the range of $6\sigma$-$8\sigma$ for the triggering of a planned disconnection of the transformer 100; within the range of $4\sigma$-$6\sigma$ for issuing an alarm; and within the range of $2\sigma$-$4\sigma$ for increasing the monitoring measurement rate and performing a further analysis. A set of two or more values of $DEV_{max}$ could be defined for the same monitoring procedure, if desired, so that a first action is triggered upon the deviation exceeding a first $DEV_{max}$, a second action is triggered upon the deviation from a second $DEV_{max}$, etc.

The method of FIG. 6*b* could include a step 600 wherein a value of the transformer property is determined from the $T(I_2)$-relation provided by the coefficients determined in step 505. Hence, the determination and the monitoring flowcharts shown in FIGS. 6*a* and 6*b* could be combined. For example, step 615 could, instead of the check of the quantity T, involve a check as to whether the value of a transformer property, derived from the quantity T, deviates from the value of the property obtained from the coefficients determined in step 505. Such determination of the present value of a transformer property would involve collecting measurements at different loads, and performing a new fit of the measured values to the applicable $T(I_2)$-relation.

The currents and voltages $V_1$, $V_2$, $I_1$, and $I_2$ as used above represent the fundamental frequency components at 50/60 Hz of the currents and voltages, respectively. These currents and voltages are complex quantities and can for example be expressed as phasors. The phasor of a current/voltage can for example be determined by applying a Fast Fourier Transform to a continuous measurement of the voltage/current at a relevant terminal pair 115, 120, or by applying a Discrete Fourier Transform to a set of samples of the relevant voltage/current, where the sampling rate could for example be 1000 Hz. In order to improve the accuracy of the phasor value, an average of several phasors could be determined, for example as a moving average. In a monitoring situation, there is generally no time pressure, and ample time could be spent on collecting the measurement results, if desired. Other ways of obtaining the phasor values from measurements may be used.

The fundamental frequency of a power transmission system may, from time to time, deviate from the nominal frequency of 50/60 Hz. For example, in Europe, a deviation of ±0.2% is generally tolerated. Frequency variations may influence the value of the measured phasor, so that the accuracy of the determination of the transformer properties is reduced if measurements are taken at different frequencies. In order to improve the accuracy of the determined transformer properties, the power transmission frequency could be monitored, and measurements which were performed at the a particular frequency (e.g. 50/60 Hz), or in a certain frequency range (e.g. 50/60 Hz±0.1%), could be selected for the determination of the transformer quantities.

Figure 7A:
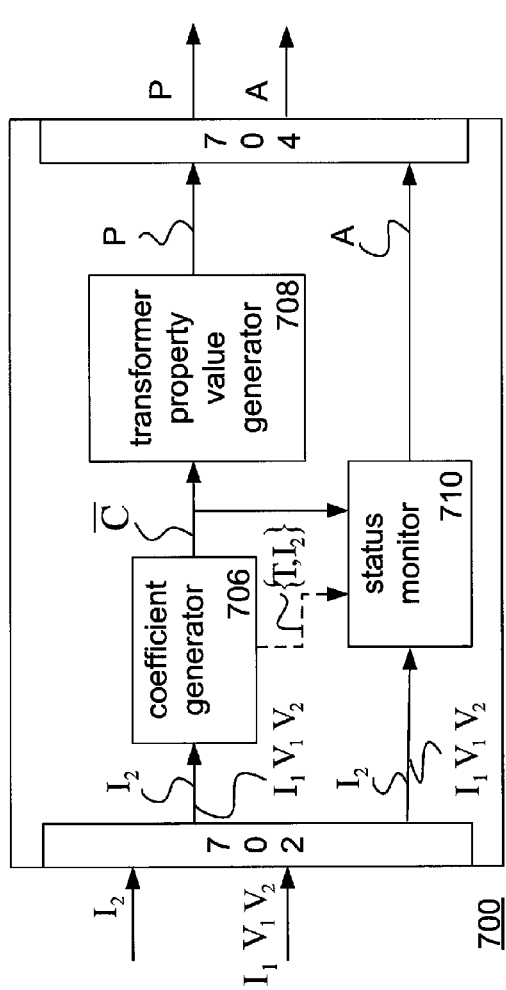
FIG. 7a is an example of an embodiment of a diagnosis apparatus according to the invention.
Figure 7B:
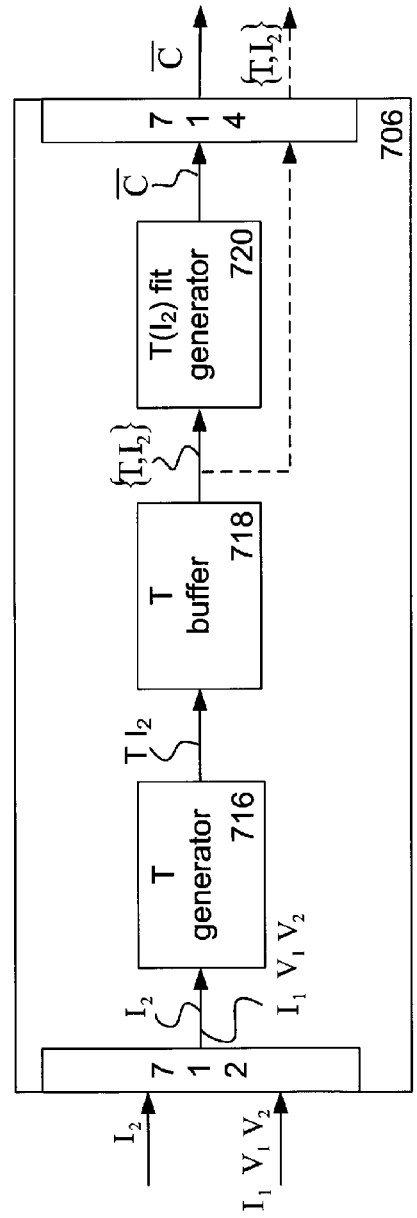
FIG. 7b is an example of an embodiment of a coefficient generator.
Figure 7C:
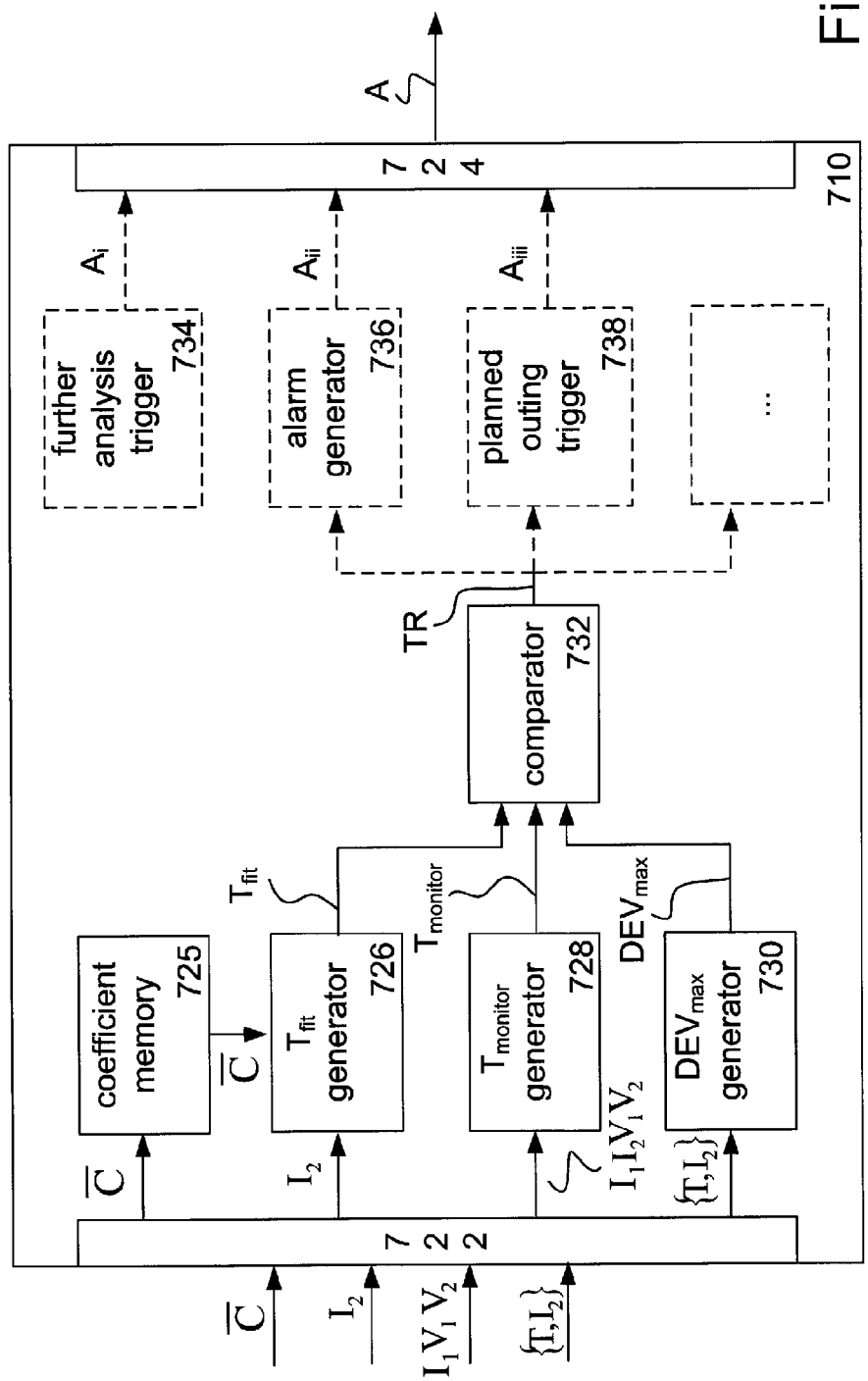
FIG. 7c is an example of an embodiment of a status monitor.

FIGS. 7*a*-*c* schematically illustrate an embodiment of a transformer diagnosis apparatus 700. In FIG. 7*a*, the transformer diagnosis apparatus 700 is shown to comprise an input 702, an output 704, a coefficient generator 706, a transformer property value generator 708 and a status monitor 710. Input 702 is arranged to receive a signal $I_2$ indicative of the load current, as well as at least one further AC signal $I_1$, $V_1$ and/or $V_2$. Input 702 is connected to measurement equipment (not shown), such as current and voltage transformers, arranged to measure AC signals at the source and load winding terminals 115/120 of a transformer 100. Input 702 is connected to an input of the coefficient generator 706. Coefficient generator 706 is arranged to generate, from input signals received at input 702, coefficients $\overline{C}$ of an $T(I_2)$-relation (cf. expressions ((4b), (5a) and (6b)). An output of coefficient generator 706 is, in the embodiment of the diagnosis apparatus 700 shown in FIG. 7*a*, connected to a transformer property value generator 708 as well as to a status monitor 710. Transformer property value generator 708 is configured to generate, from coefficients $\overline{C}$ received from the coefficient generator 706, a value of at least one transformer property P (where P can for example be the turns ratio n; the short circuit impedance $Z_w$, the impedance of the source winding, the impedance of the load winding, and/or the high load magnetizing current $I_0$). As shown in FIG. 7*a*, transformer property value generator 708 of FIG. 7*a* is further configured to output a signal indicative of the value of P. The transformer property value generator 708 has a memory for storing the format of one or more $T(I_2)$-relations (cf. expressions (4b), (5a) and (6b)), from which a value of a transformer property can be determined once the coefficients are known, as described above.

The input of status monitor 710 is further connected to input 702 and arranged to receive signals indicative of measured load and further AC signal(s). In one embodiment, discussed in relation to FIG. 7c, the status monitor 710 is further arranged to receive a set $\{T,I_2\}$ of T measurements with corresponding loads $I_2$ from the coefficient generator 706, as indicated by the dashed line. The status monitor 710 is configured to monitor the status of the transformer 100, and to generate an action signal A should any significant deviation from the expected behaviour be detected. The outputs of the transformer property value generator 708 and of the status monitor 710 are connected to the output 704 of the transformer diagnosis apparatus 700. The output 704 is arranged to deliver a diagnosis result signal, of which A and P form examples.

The transformer value generator 708 and the status monitor 710 form two different examples of transformer diagnosis mechanisms which utilise a set of coefficients generated by the coefficient generator 706 in generating a diagnosis result. Other embodiments of diagnosis apparatus 700, where only one of the transformer property value generator 708 and status monitor 710 is present, are also foreseen.

In FIG. 7b, an embodiment of a coefficient generator 706 is shown in more detail. Coefficient generator 706 of FIG. 7b comprises an input 712, an output 714, a T generator 716 arranged to determine a measure value ($T_{measured}$) of a property T; a T buffer 718 and a $T(I_2)$ fit generator 720. T generator 716 is arranged to receive the load signal $I_2$ as well as a suitable selection of the further AC signal(s) $I_1$, $V_1$ and/or $V_2$, depending on which quantity T the T-generator 716 is arranged to generate. From these received signals, the T-generator 716 is configured to generate a measured value of a property T, by use of a suitable expression (cf. expressions (4a), (5b) and (6a)), and to output the value together with a value of the load $I_2$ at which the T value was obtained. The output of the T-generator 716 is connected to the input of the T buffer 718, which is arranged to store a set of different T values received from T generator 716 together with an indication of the load $I_2$ at which the T value was obtained. The output of T buffer 718 is connected to the input of the $T(I_2)$ generator 720, and arranged to deliver a signal indicative of a set $\{T,I_2\}$ of T values, for example upon request from the $T(I_2)$ fit generator, upon a manual request, or when a certain number of T-values have been received. The $T(I_2)$-generator 720 is configured to fit the received set of $\{T,I_2\}$ values to the appropriate $T(I_2)$-relation (cf. step 505 of FIG. 5), for example by means of a least square fit as well known in the art. The $T(I_2)$-generator 720 is further configured to output, to output 714, a signal C indicative of the coefficients resulting from the fitting operation performed. In one embodiment of the coefficient generator 706, the output 714 is further connected to an output of the T buffer 718, so that a $\{T,I_2\}$ signal may be generated at the output 714.

In FIG. 7c, an embodiment of a status monitor 710 is shown in more detail. The status monitor 710 comprises an input 722, an output 724, a coefficient memory 725, a $T_{fit}$ generator 726, a $T_{monitor}$ generator 728, a $DEV_{max}$ generator 730 and a comparator 732. The status monitor 710 further comprises at least one action mechanism, of which a further analysis trigger 734, an alarm generator 736 and a planned outing trigger 738 are shown as examples. The input 722 of the status monitor 710 of FIG. 7c is arranged to receive a signal $\overline{C}$ indicative of a set of coefficients of a $T(I_2)$ relation, a signal $I_2$ indicative of a current transformer load, at least one further current AC signal $I_1$, $V_1$ and/or $V_2$, and a set of $\{T,I_2\}$ values, which have typically been collected during a learning process. The coefficient memory 725 is connected to the input 722 and arranged to receive a signal $\overline{C}$, and to store the coefficients for future use. Coefficient memory 725 could, in one implementation, be arranged to store more than one set of coefficients $\overline{C}$, representing different fits of the $T(I_2)$ relation performed on different sets of $\{T,I_2\}$ data. An output of the coefficient memory is connected to the $T_{fit}$ generator 726. In one implementation, the coefficient memory 725 is arranged to deliver a signal indicative of the coefficients C upon request from the $T_{fit}$ generator. The $T_{fit}$ generator 726 is further connected to the input 722 and arranged to receive a signal $I_2$ indicative of the current transformer load. The $T_{fit}$ generator 726 is configured to derive, from a received $I_2$ signal and a suitable $T(I_2)$-relation, using coefficients $\overline{C}$ received from the coefficient memory 725, a fitted value of T, $T_{fit}$, at the present load. Examples of $T(I_2)$ relations are given in expressions (4b), (5a) and (6b). The $T_{fit}$ generator 726 is further arranged to deliver a signal $T_{fit}$, indicative of a derived value, at an output.

The $T_{monitor}$ generator 728, on the other hand, is configured to derive a value of T from a corresponding suitable measurement-based expression, examples of which are given in expressions (4a), (5b) and (6a). $T_{monitor}$ generator 728 is connected to the input 722 and arranged to receive a suitable selection of the AC signals $I_1$, $I_2$, $V_1$ and $V_2$, the selection depending on which quantity T is to be determined $T_{monitor}$ generator 728 is further arranged to deliver a signal $T_{monitor}$, indicative of a derived value, at an output. $T_{monitor}$ generator 728 typically functions in the same manner as T generator 716, and could in fact be implemented by the same hardware/software.

The comparator 732 is connected to the outputs of the $T_{fit}$ generator 726 and the $T_{monitor}$ generator 728. Comparator 732 is configured to determine whether the deviation of a $T_{monitor}$ value from the corresponding $T_{fit}$ value exceeds a maximum acceptable deviation $DEV_{max}$. The comparator 732 is arranged to deliver, upon determining that the deviation of a received $T_{monitor}$ value from a corresponding $T_{fit}$ value exceeds $DEV_{max}$, a trigger signal TR.

$DEV_{max}$ could for example be a fixed value, or could, as in the embodiment of FIG. 7c, be determined from the set of $\{T, I_2\}$ data used in determining the coefficients $\overline{C}$. $DEV_{max}$ generator 730 of FIG. 7c is arranged to receive a set of $\{T,I_2\}$ data, and configured to derive a value of $DEV_{max}$ from the set, for example using a method described in relation to step 605 of FIG. 6b. $DEV_{max}$ generator 730 of FIG. 7c includes a memory for storing a derived value of $DEV_{max}$, and is arranged to deliver a value of $DEV_{max}$ at an output connected to the comparator 732. In implementations wherein $DEV_{max}$ takes a fixed value, $DEV_{max}$ generator 730 could be reduced to a memory.

A status monitor 710 further includes at least one action mechanism, connected to the output of the comparator 732 and configured to generate an action signal $A_i$ should a deviation have been detected by the comparator 732. Status monitor 710 of FIG. 7c includes the following action mechanisms: a further analysis trigger 734, an alarm trigger 736 and a planned outage trigger 738. Different action mechanisms of a status monitor 710 could be invoked at different situations—for example, the further analysis trigger 734 could be invoked when a first deviation is detected, an alarm generator 736 could then be invoked should the further analysis indicate that attention from an operator is required, a planned outing trigger 738 could be invoked should the deviation be of a certain magnitude, etc.

The transformer diagnosis apparatus 700 is described above in terms of a single quantity T used in the analysis of the status of the transformer. However, a transformer diagnosis apparatus 700 could be configured to use two or more different quantities T in the diagnosis. Two or more quantities T could for example be monitored in parallel, or a deviation in a first quantity T could trigger the analysis of a further quantity, etc.

Figure 8:
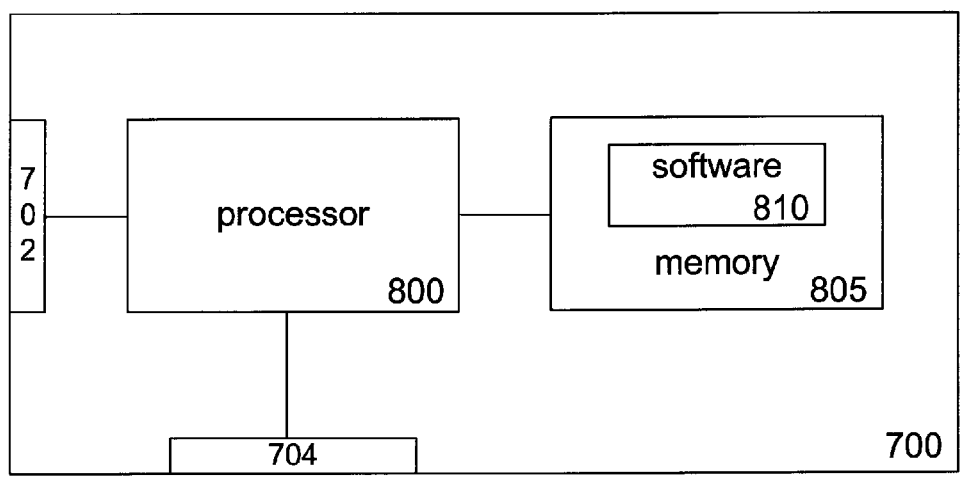
FIG. 8 is an alternative illustration of a diagnosis apparatus, a coefficient generator, a transformer property value generator, or a status monitor.

The components of the transformer diagnosis apparatus 700 described in relation to FIGS. 7a-7c could be implemented by use of a suitable combination of hardware and software. In FIG. 8, an alternative way of schematically illustrating an embodiment of a diagnosis apparatus 700 is shown. FIG. 8 shows a diagnosis apparatus 700 comprising a processor 800 connected to a memory 805, as well as to input 702 and output 704. The memory 805 comprises computer readable means that stores computer program(s) 810, which when executed by the processing means 800 causes the diagnosis apparatus 700 to perform the method illustrated in FIG. 5 (or an embodiment thereof). In other words, the diagnosis apparatus 700 and its mechanisms 706, 708 and 710 are in this embodiment implemented with the help of corresponding program modules of the computer program 810.

The processor 800 could, in an implementation, be one or more physical processors. The processor could be a single CPU (Central processing unit), or it could comprise two or more processing units. For example, the processor may include general purpose microprocessors, instruction set processors and/or related chips sets and/or special purpose microprocessors such as ASICs (Application Specific Integrated Circuit). The processor may also comprise board memory for caching purposes. Memory 805 comprises a computer readable medium on which the computer program modules, as well as relevant data, are stored. The memory 805 could be any type of non-volatile computer readable memories, such as a hard drive, a flash memory, a CD, a DVD, an EEPROM etc, or a combination of different computer readable memories. The computer program modules described above could in alternative embodiments be distributed on different computer program products in the form of memories within a diagnosis apparatus 700.

Many transformer installations are equipped with a protection system arranged to measure the terminal voltages and currents in order to allow for fast disconnection of the transformer, should any problem that is detectable by the protection system occur. Generally, such protection system is arranged to react on instant values only, and no monitoring of the currents and voltages in the transformer is performed. Nevertheless, the same current and voltage measurement sensors as are used for the protection system, could, if desired, also be used for the monitoring purposes of the technology described herein. Thus, measurements to be used in the determination of transformer properties and/or in the monitoring of transformer properties could generally be obtained without the need for large hardware investments. Suitable current measurement equipment could for example be current transformers. Suitable voltage measurement equipment could for example be voltage transformers. In the monitoring application, deviations in quantities can be monitored, rather than the actual values of the quantities, and hence, the accuracy requirements of the measurement equipment are less than in a monitoring method where the actual value of a transformer property is required. If the same measurement equipment is used for both establishing the $T(I_2)$ relation(s) and for the monitoring measurements, any offset in the output from the equipment can be disregarded for monitoring purposes.

Figure 9:
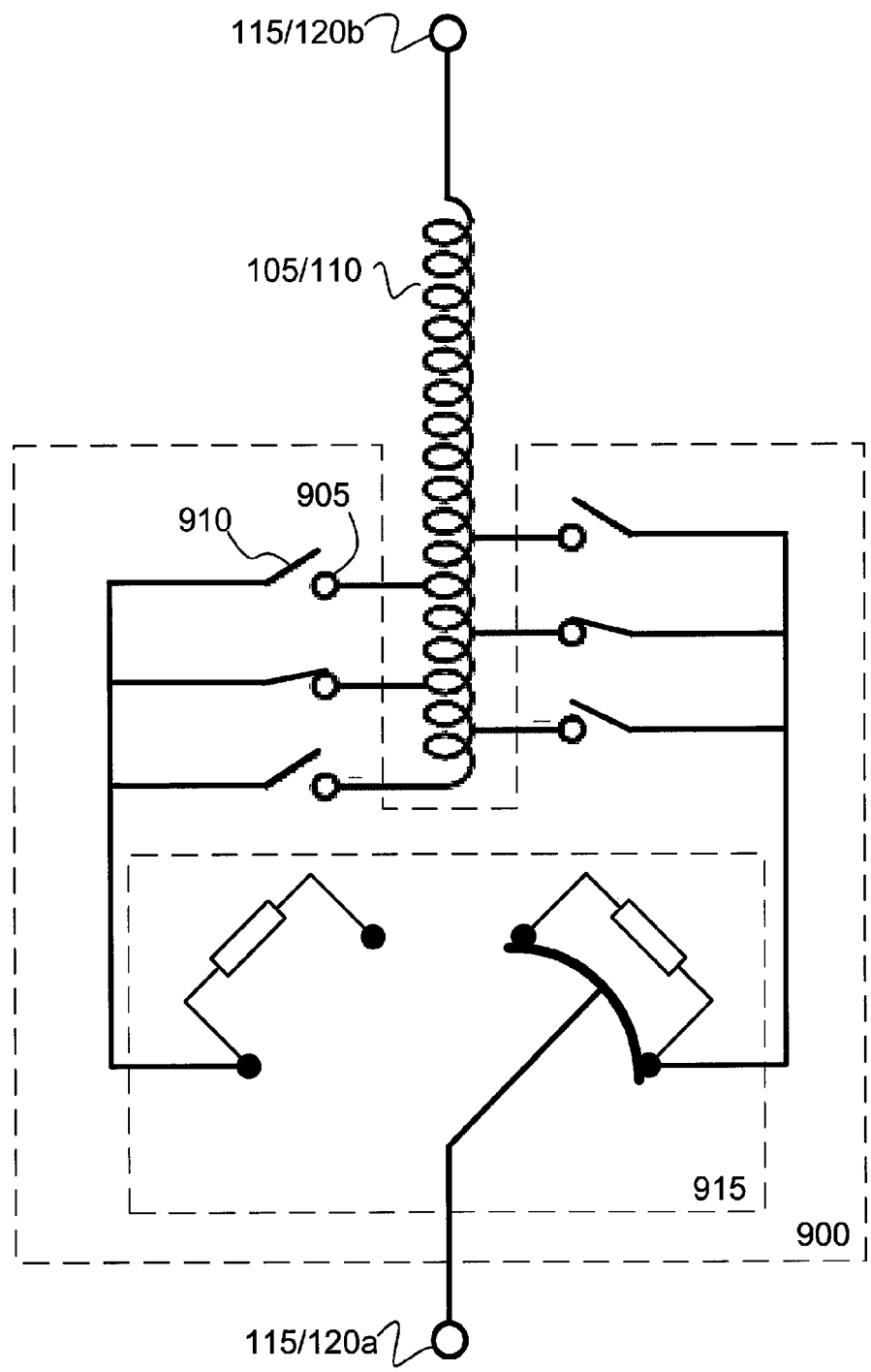
FIG. 9 is a schematic illustration of a transformer having a tap changer.

In a transformer 100 having a tap changer by means of which the turn ratio n may be varied, further analysis of the measurement results could in some scenarios provide information on the location of a fault giving rise to a deviation from the expected value of a transformer property. A winding 105/110 being equipped with a tap changer 900 is schematically illustrated in FIG. 9, where the tap changer 900 is shown to have six different taps 905, each equipped with a tap selector switch 910 and by means of which six different states of the tap changer 900 can be achieved, each state providing a particular number of winding turns. A diverter switch 915 is also provided, the diverter switch being arranged to take one of two different positions, where in a first position, a winding terminal 115/120a is connected to a first set of the tap selector switches 910, and in a second position, the winding terminal 115/120a is connected to a second set of the tap selector switches. By closing a particular tap selector switch 910 and ensuring that the diverter switch 915 is in a position wherein the particular tap selector switch 910 is connected to the winding terminal 115/120a, a particular state of the tap changer 900 will be achieved.

For a quantity T which depends on the turn ratio n, the coefficients for the relation between the quantity T and the load current $I_2$ will depend on the state of the tap selector 900. Hence, coefficients for a relation between one (or more) quantities T and $I_2$ could be determined for more than one (and possibly each) state of the tap changer 900, thus giving different expected values of the transformer properti(es) for different states of the tap changer 900. Monitoring of the transformer properti(es) while the tap changer 900 is in different states can thus give information on the location of a fault giving rise to deviations in a transformer property, depending on the fault location in relation to the location of the different taps 905. For example, if the resistance of one of the tap selector switches 910 is increased, for example due to coking or other contaminations, the value of the voltage drop $\Delta V$ obtained from relation (4a) only deviate from the expected value when the tap changer is in the corresponding position. Similarly, if a turn-to-turn fault has occurred in a part of a winding 105, 110 that can be disconnected by means of the tap changer 900, the value of the turns ratio obtained from relation (5a) will only deviate from the expected value when the tap changer 900 is in a state in which the part wherein the fault has occurred is connected between the winding terminals 115/120a and 115/120b.

In the above, several embodiments of the present invention have been developed by use of the equivalent circuit for a non-ideal transformer 100 shown in FIG. 2b, where the impedances, voltages and currents of the load side have been reflected on the source side. The equivalent model for a non-ideal transformer 100 shown in FIG. 2c, wherein the source side impedance, current and voltages are reflected to the load side, could alternatively be used in these embodiments of the above discussed transformer diagnosis technique. When using the equivalent model of FIG. 2c, expressions (5a) and (5b), as well as expressions (6a)-(6c), will remain unaltered. However, instead of using expressions (4a) and (4b), the following expressions could advantageously be used:

$$\Delta V' = \frac{V_1}{n} - V_2 \qquad (4a')$$

and $$\Delta V' = \frac{1}{n}\left[Z_1 I_0 + \frac{Z_w}{n} I_2\right] = \frac{1}{n}\Delta V. \qquad (4b')$$

Furthermore, the above discussion has been made in terms of a transformer 100 having two windings. In some applications, a transformer 100 having three or more windings may be used. Any winding(s) present in addition to the above discussed source and load windings will hereinafter be referred to as further winding(s). Further winding(s) could be source winding(s) and/or load winding(s). Oftentimes, the power in any further winding(s) is insignificant or approximately constant, and does not have to be taken into account for the purposes of determining/monitoring of transformer properties—the error caused by such currents is typically insignificant and/or constant. However, even if the power dissipation in one or more further winding(s) is significant, the inventive determining/monitoring described above could still be made. Depending on the configuration of the additional winding(s), expressions (4a)-(6c) can be adapted accordingly. As an example, for a transformer with two load windings and one source winding, expression (5a), can successfully be adapted to:

$$I_1 = \frac{n_2}{n_1} I_2 + \frac{n_3}{n_1} I_3 + I_0 \quad (5a^*)$$

where the index 3 denotes the further winding. From expression (5a*), magnetizing current $I_0$ and the turn ratios $n_2/n_1$ and $n_3/n_1$ can be found with a two-dimensional fit, for example using stochastic variations in $I_2$ and $I_3$ and at least three measurements.

In the same configuration, expression (4b) can be adapted to separate into one relation for each load winding, i, as $$\Delta V_{12} = V_1 - \frac{n_1}{n_2} V_2 = Z_1 I_1 + Z_2 I_{12} = Z_1 I_0 + Z_1 I_{31} + (Z_1 + Z_2) I_{12} \quad (4b^*)$$

$$= Z_1 (I_0 + I_{13}) + Z_{w12} I_{12}$$

$$\Delta V_{13} = V_1 - \frac{n_1}{n_3} V_3 = Z_1 I_1 + Z_3 I_{13} = Z_1 (I_0 + I_{12}) + Z_{w13} I_{13}$$

When the turn ratios, $n_i/n_1$, are known, this set of relations determine the winding impedances using a two dimensional fit to the two load currents. Furthermore, in this configuration, expression (6a) is simply the difference between power flowing in and out of the transformer 100:

$$S_{loss} = V_1 I_1^* - V_2 I_2^* - V_3 I_3^* \quad (6a^*)$$

A similar adaptation of expressions (4b)-(6c) could be made for a transformer 100 of any winding configuration. Generally, when the total number of windings of the transformer is N, the transformer properties can be obtained by using an N–1-dimensional fit of at least N measurements.

The above description of the inventive method and apparatus for transformer diagnosis has been given in terms of a single phase only. However, the method can be applied to the diagnosis of transformers of any number of phases, and in particular to three phase transformers. The method can be applied to each of the phase transformers separately, once the individual currents through the windings and voltages have been determined. The configuration of the phases often implies that the terminal current/voltages do not directly give the individual currents and voltages. A Δ-Y configuration, for example, results in a phase shift of 30 degrees between the source and load side terminal currents and voltages, as well as a difference in magnitude by a factor of √3 between the terminal current and the winding current in the Δ side and between terminal-to-terminal voltage and winding voltage on the Y side. The individual current and voltages can typically be determined from measurements of the terminal currents and voltages, as described for example in US6507184 B1.

In the following, for ease of description, the term "monitor a quantity" will be used to refer to the monitoring of either a quantity, or the monitoring of a property derived from a value of the quantity.

One skilled in the art will appreciate that the technology presented herein is not limited to the embodiments disclosed in the accompanying drawings and the foregoing detailed description, which are presented for purposes of illustration only, but it can be implemented in a number of different ways, and it is defined by the following claims.

Although various aspects of the invention are set out in the accompanying claims, other aspects of the invention include the combination of any features presented in the above description and/or in the accompanying claims, and not solely the combinations explicitly set out in the accompanying claims.

What is claimed is:

1. A transformer diagnosis apparatus connected in a power transmission and/or distribution system, the transformer diagnosis apparatus comprising:
   an input unit configured to receive signals indicative of AC signal measurements of a transformer, including measurements indicative of transformer load current;
   an output unit configured to deliver a transformer diagnosis result;
   a coefficient generator connected to the input unit and arranged to
      collect, for at least two different transformer loads, measurements of a current being indicative of the transformer load, and measurements of at least one further transformer AC signal transmitted from at least one of a transformer measurement device or a non-transitory computer readable medium, without having to configure the transformer offline;
      derive, from the collected measurements, at least two values of a quantity which depends on at least one transformer property as well as on transformer load; and
      determine, from the derived values, a set of coefficients of a relation for how said quantity is expected to vary with transformer load, wherein said relation is based on a transformer model, in which effects of magnetizing currents in a transformer core, leakage inductances and effective resistances of primary and secondary windings are taken into account, and wherein at least one parameter of the model corresponds to one of said at least one transformer property; and
   a transformer property value generator connected to the coefficient generator to receive output from the coefficient generator and arranged to
      determine a value of at least one of the at least one transformer property from at least one coefficient of the coefficients
      wherein the determined transformer property value corresponds to the value of one of said at least one parameter of said transformer model, and wherein a transformer property is one of the following transformer properties: the short circuit impedance, $Z_w$; the impedance of a source winding, $Z_1$; the impedance of a load winding, $Z_2$; the turns ratio, n; and the magnetization current, $I_0$.

2. The transformer diagnosis apparatus of claim 1, further comprising a status monitor arranged to:
   collect an on-line monitoring measurement of at least one terminal AC signal at a first monitoring load;
   derive a measured-based value of the quantity from the monitoring measurement;
   determine an expected value of the quantity at the first monitoring load using said relation and said coefficients;

compare the measured-based value of the quantity with the corresponding expected value so as to detect any transformer problem giving rise to a change in the quantity.

3. The transformer diagnosis apparatus of claim 2, wherein the coefficient generator is arranged to collect further on-line monitoring measurements of at least one terminal AC signal at at least one further load;

the coefficient generator is arranged to determine another set of coefficients for said relation from the on-line monitoring measurements;

the transformer property value generator is arranged to derive a further value of said transformer property from the another set of coefficients; and the status monitoring is arranged to compare the expected value and the further value of the transformer property in order to detect any changes in said transformer property.

4. The transformer diagnosis apparatus of claim 2, wherein the status monitor arranged to generate an action signal triggering at least one of further analysis of the transformer, an alarm indicating a problem with the transformer, or a planned outage.

5. A transformer comprising a transformer diagnosis apparatus according to claim 1.

6. The transformer of claim 5, further comprising a tap changer, wherein the coefficient generator is arranged to:

generate a set of coefficients for each of the tap changer tap points; and to determine, if a deviation is detected, at which tap changer positions the deviation occurs.

7. The transformer diagnosis apparatus of claim 1, wherein the relation for how the quantity varies with transformer load is a linear relation, wherein the slope and/or the intersection at zero load is indicative of a transformer property.

8. The transformer diagnosis apparatus of claim 7, wherein said quantity is the difference ($\Delta V$, $\Delta V'$) between the voltage across the terminals of a first winding on a first side of the transformer and the voltage across a second winding on a second side of the transformer as reflected to the first side.

9. The transformer diagnosis apparatus of claim 8, wherein said relation can be expressed as:

$$\Delta V = Z_1 I_0 + \frac{Z_w}{n} I_2,$$

or $$\Delta V' = \frac{1}{n}\left[Z_1 I_0 + \frac{Z_w}{n} I_2\right],$$

wherein where $Z_1$ is the impedance of the source winding; $I_0$ is the magnetizing current; n is the ratio of the number of turns of the source winding to the number of turns of the load winding; $Z_w$ is the total winding impedance; $I_2$ is the load current; $\Delta V$ is the difference between the voltage across the terminals of the source winding and the voltage across the load winding as reflected to the source side; and $\Delta V'$ is the difference between the voltage across the source winding as reflected to the load side and the voltage across the terminals of the load winding.

10. The transformer diagnosis apparatus of claim 7, wherein the quantity is a source current.

11. The transformer diagnosis apparatus of claim 10, wherein said relation can be expressed as:

$$I_1 = \frac{1}{n} I_2 + I_0,$$

wherein $I_1$ is the source current; $I_2$ is the load current; $I_0$ is the magnetizing current; and n is the ratio of the number of turns of the source winding to the number of turns of the load winding.

12. The transformer diagnosis apparatus of claim 11, wherein said quantity is the power loss inside the transformer.

13. The transformer diagnosis apparatus of claim 11, wherein said relation can be expressed as:

$$S_{loss} = V_1 I_0^* + Z_1 \frac{I_0 I_2^*}{n} + Z_w \frac{I_2 I_2^*}{n^2},$$

wherein $S_{loss}$ is said power loss; $Z_1$ is the impedance of the source winding; $I_0$ is the magnetizing current; n is the ratio of the number of turns of the source winding to the number of turns of the load winding; $Z_w$ is the total winding impedance; $V_1$ is the voltage across the source winding and $I_2$ is the load current.

14. The transformer diagnosis apparatus of claim 1, wherein the coefficient generator, in determining a set of coefficients of a relation, is arranged to perform an N−1 dimensional fit of at least N derived values of the quantity, where N represents the number of windings of the transformer to be diagnosed.

* * * * *